United States Patent [19]

Milkovic

[11] 3,934,198

[45] Jan. 20, 1976

[54] MULTI-WIRE ELECTRONIC KWH METER

[75] Inventor: Miran Milkovic, Scotia, N.Y.

[73] Assignee: General Electric Company, Schenectady, N.Y.

[22] Filed: Nov. 6, 1974

[21] Appl. No.: 521,299

[52] U.S. Cl. ............................... 324/142; 324/141
[51] Int. Cl.² ........................................ G01R 11/32
[58] Field of Search .................... 324/141, 142, 107

[56] References Cited
UNITED STATES PATENTS

| | | | |
|---|---|---|---|
| 1,915,581 | 6/1933 | Schneider | 324/141 |
| 3,794,917 | 2/1974 | Martin et al. | 324/142 |

*Primary Examiner*—Alfred E. Smith
*Assistant Examiner*—Wm. H. Punter
*Attorney, Agent, or Firm*—Vale P. Myles

[57] ABSTRACT

The metering of kilowatt hours in a single phase, three wire electrical system is accomplished by generating a first analog voltage which is representative of the voltage of the power consuming system. Second and third analog signals are generated which represent the current flowing through each of two of the three wires of the single phase power consuming system. The voltage representative analog signal is multiplied by each of the second and third current representative analog signals in either a direct pulse width amplitude multiplying network or in a feedback type pulse width amplitude time division multiplier network. A constant amplitude triangular generator is associated with the multiplier and the multiplier is implemented using C-MOS technology. The output modulated pulse signals from the multiplier are summed and converted in, for example, a low pass filter to a signal having an amplitude representative of the power in the power consuming system. An analog-to-pulse rate converter is used for converting the signal representing the average power to a series of output signals having a variable pulse repetition rate which is proportional to the average power, each output pulse signal representing a quantized amount of electrical energy. A stepping switch and register perform conventional accumulation, storage and display functions in response to the series of output pulse signals delivered thereto.

14 Claims, 9 Drawing Figures

MULTI-WIRE ELECTRONIC KWH METER

CROSS REFERENCES TO RELATED PATENT APPLICATIONS

A related copending U.S. patent application, Ser. No. 361,030, filed May 17, 1973, now U.S. Pat. No. 3,875,509 in behalf of the inventor-applicant, Miran Milkoxic, titled "Electronic Metering of Active Electrical Energy (kWh)", discloses and claims a method and apparatus for measuring kWh in polyphase systems.

Another related copending U.S. patent application, Ser. No. 395,142, filed Sept. 7, 1973, now U.S. Pat. No. 3,875,508 in behalf of inventor-applicant, Miran Milkovic, titled "Metering Electrical Energy (kWh) in Single Phase Systems" discloses and claims a method and apparatus for metering electrical energy in single phase systems.

A further related copending U.S. patent application, Ser. No. 365,429, was filed on May 31, 1973, now U.S. Pat. No. 3,815,013 in behalf of the inventor-applicant, Miran Milkovic, titled "Current Transformer with Active Load Termination" which discloses and claims a current-to-voltage converter which may be employed to advantage in the invention hereinbelow disclosed.

Another related copending U.S. patent application Ser. No. 346,411, filed Mar. 30, 1973, now U.S. Pat. No. 3,815,011 in behalf of the inventor-applicant, Miran Milkovic, titled "Current Transformer Terminated by Active Load Elements for Providing Phase-Inverted Signals" which discloses and claims a current to voltage converter which provides a pair of phase inverted output voltages proportional to current in the primary winding of a current transformer. The aforesaid Miran Milkovic is the same inventor-applicant in whose behalf this application is filed.

The entire right, title and interest in and to the inventions described in the aforesaid patent applications as well as the entire right, title and interest in and to the invention hereinafter disclosed as well as in and to the patent specification of which this specification is a part are assigned to the same assignee.

BACKGROUND OF THE INVENTION

The subject invention pertains generally to metering active electrical energy by solid state electronic techniques and more particularly in one aspect relates to metering active electrical energy (for example, kWh) in three-wire, single phase electrical systems.

Electrical energy (kWh) has been and continues to be metered with the familiar rotating disk-type of meter. In addition, the instrumentation and metering arts include proposed systems having apparatus employing electronic and solid state devices for measuring power and energy. In such apparatus, electronic and solid state devices replace the conventional rotating disk.

Further, there is disclosed and claimed in applicant's copending applications, referred to above, apparatus and methods for metering electrical energy in an electrical system which involves producing analog signals from line currents and voltages. Pairs of analog signals representing current and voltage variables are processed in time divison multiplier networks which multiply the analog signals to produce a series of width and amplitude modulated pulse signals, each representing instantaneous partial power in a polyphase system and instantaneous total power in a single phase system. In the general case of a polyphase system, pulse signals from different multiplier networks are summed to provide another series of pulse signals each representing instantaneous total power. The series of pulse signals representing instantaneous total power are processed through a low pass filter to produce another signal representative of average total power in the system. Subsequently, the signal representing average total power is processed in an analog-to-pulse rate converter which produces a series of output pulse signals each representing a quantized amount of electrical energy. A stepping switch and register perform conventional accumulation, storage and display functions in response to the series of output pulse signals delivered thereto.

In the past, when more than one current variable was being detected, a corresponding number of multiplier networks has been required in order to provide an output signal which was directly proportional to the product of the sensed currents and the voltage variable. Because of the electronics utilized in the multiplier and because of space requirements, it has become desirable to provide an electrical metering system wherein more than two electrical current variables can be detected and multiplied by a single multiplier circuit to provide a composite signal representative of the power flowing in a single phase, multi-wire system.

It therefore is an object of the present invention to provide a method and apparatus for use in a solid state elecrical energy metering system for multiplying electrical analog signals representing voltage and at least two current variables in a power consuming system to produce a series of amplitude and pulse width modulated pulses.

It is another object of this invention to provide such a multiplier apparatus and method utilizing solid state circuitry which may be fabricated in the form of monolithic integrated structures.

It is yet another object of this invention to provide such a method and apparatus for use in a solid state electrical energy measuring system wherein either a feedback type or a direct type multiplier circuit can be utilized to generate a composite signal representing the power consumed in a single phase, multi-wire system.

SHORT STATEMENT OF THE INVENTION

Accordingly, this invention relates to an electronic kWh meter for metering electrical energy in a multi-wire, single phase power consuming system which includes means for developing an analog signal representative of the voltage of the power consuming system and means for generating at least two analog signals representative of the current flowing through the wires of said power consuming system. The current and voltage analog signals are simultaneously multiplied in either a direct type pulse modulator or in a feedback type pulse modulator which functions to simultaneously effectively multiply the voltage related analog signal by each of the current related analog signals and thereby produce a series of width and amplitude modulated pulse signals, each representing a partial instantaneous power of the system. The resulting pulse signals are summed to provide a composite power signal representing the instantaneous power of the power consuming system. The series of pulse signals representing the instantaneous total power are processed through a low pass summing filter which produces a DC signal representative of the average total power in the system. The average total power signal is processed in a quantizing analog-to-pulse rate converter which produces a series of output pulse signals each representing a quantized amount of electrical energy. A stepping switch and register perform conventional accumulation, storage and display functions in response to the series of output pulse signals delivered thereto.

Circuits are provided in the multiplier for terminating the instrument current transformers in a virtual short circuit condition while enabling the development of an output voltage signal which is proportional to the current in the primary winding of the transformer and more specifically, to terminating an instrument current transformer in a virtual short circuit condition while enabling the development of multiple output voltage signals, each of which is proportional to current in the primary winding of the current transformer as well as phase displaced 180° with respect to one another.

BRIEF DESCRIPTION OF THE DRAWINGS

Other objects, features and advantages of the present invention will become more fully apparent from the following detailed description of the preferred embodiment, the appended claims and the accompanying drawings in which:

DETAILED DESCRIPTION OF THE PREFERRED EMBODIMENT

Figure 1:
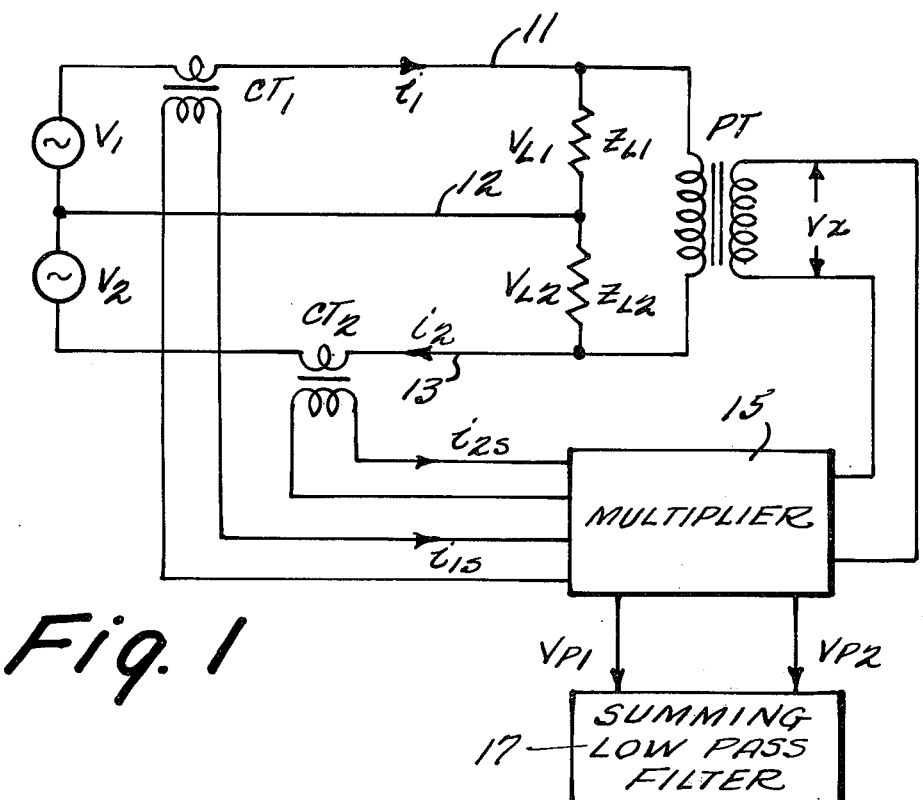
FIG. 1 is a schematic illustration of the single phase, three-wire electronic energy metering system of the present invention.

Refer now to FIG. 1 which is a schematic illustration of the single phase, three-wire electrical energy metering system of the present invention. A three-wire electrical power consuming system is illustrated having first and second voltage sources $V_1$ and $V_2$. Voltage source $V_1$ is connected across a load impedance $Z_{L1}$ and voltage source $V_2$ is connected across a second load impedance $Z_{L2}$ such that a current $I_1$ flows from voltage source $V_1$ through wire 11 to the load impedance $Z_{L1}$ and back to the source $V_1$ along the common wire 12 connecting the junction of impedances $Z_{L1}$ and $Z_{L2}$ and the junction of the voltage sources $V_1$ and $V_2$. The current $I_2$ generated by the voltage source $V_2$ is coupled to the impedance $Z_{L2}$ and returns to the voltage source $V_2$, as illustrated along wire 13. The voltages $V_{L1}$ and $V_{L2}$ across the load impedances are usually in phase. However, in some cases they are shifted out of phase by 120°.

The current transformer $CT_1$ is connected in circuit with the wire 11 and the current transformer $CT_2$ is connected in circuit with the wire 13 with the middle wire 12 being used as a common return. The secondary currents $I_{1s}$ and $I_{2s}$ from the transformers $CT_1$ and $CT_2$, respectively, are each coupled to the multiplier circuit 15 which will be described more fully hereinbelow.

A potential transformer PT is connected across the total load impedance of the power consuming system which comprises the load resistors $Z_{L1}$ and $Z_{L2}$. Thus, the total primary voltage $V_{L1}$ and $V_{L2}$ is transformed to the secondary of the potential transformer to form the secondary voltage $V_x$ wherein $V_x$ is proportional to one-half the sum of the voltages $V_{L1}$ and $V_{L2}$, assuming of course that $V_{L1}$ and $V_{L2}$ are equal or approximately equal. Thus, the multiplier 15 has two input currents and one voltage input.

The output voltages $V_{P1}$ and $V_{P2}$ of the multiplier 15 are given by the following expressions:

$$V_{P1} = K_1 I_{1s} V_x \qquad (1)$$

and $$V_{P2} = K_2 I_{2s} V_x \qquad (2)$$

wherein $$V_x = K_3(V_{L1} + V_{L2})/2 \qquad (3)$$

and wherein $K_1$, $K_2$ and $K_3$ are dimensional constants depending upon the gain factors of the multiplier and the potential and current transformers. The output signals $V_{P1}$ and $V_{P2}$ are each summed and filtered by a low pass filter 17 to provide a DC signal $V_F$ which is proportional to the total average power consumed in the load impedances $Z_{L1}$ and $Z_{L2}$. The voltage $V_F$ may be given by the following relationship:

$$V_F = K_4(V_{L1}I_1 \cos \theta_1) + K_5(V_{L2}I_2 \cos \theta_2) \qquad (4)$$

wherein $K_4$ and $K_5$ are dimensional constants, $V_{L1,2}$ and $I_{1,2}$ are RMS voltages and currents, respectively, and $\theta_1$ and $\theta_2$ are the load impedance phase angles of the impedances $Z_{L1}$ and $Z_{L2}$, respectively.

The DC voltage $V_F$ is converted to a pulse train having a rate which is proportional to the amplitude of $V_F$ by means of an analog-to-pulse rate converter 19. Such an analog-to-pulse rate converter has been fully described in copending U.S. patent application Ser. No. 467,889, filed May 8, 1974 titled "Analog to Pulse Rate Converter", invented by Miran Milkovic and assigned to the common assignee herewith. The disclosure of this application is hereby incorporated by reference thereto. The output of the analog-to-pulse rate converter 19 is coupled to an output display 21 which accumulates the pulses generated by the pulse rate converter 19 and displays and records the output accumulated.

Figure 2:
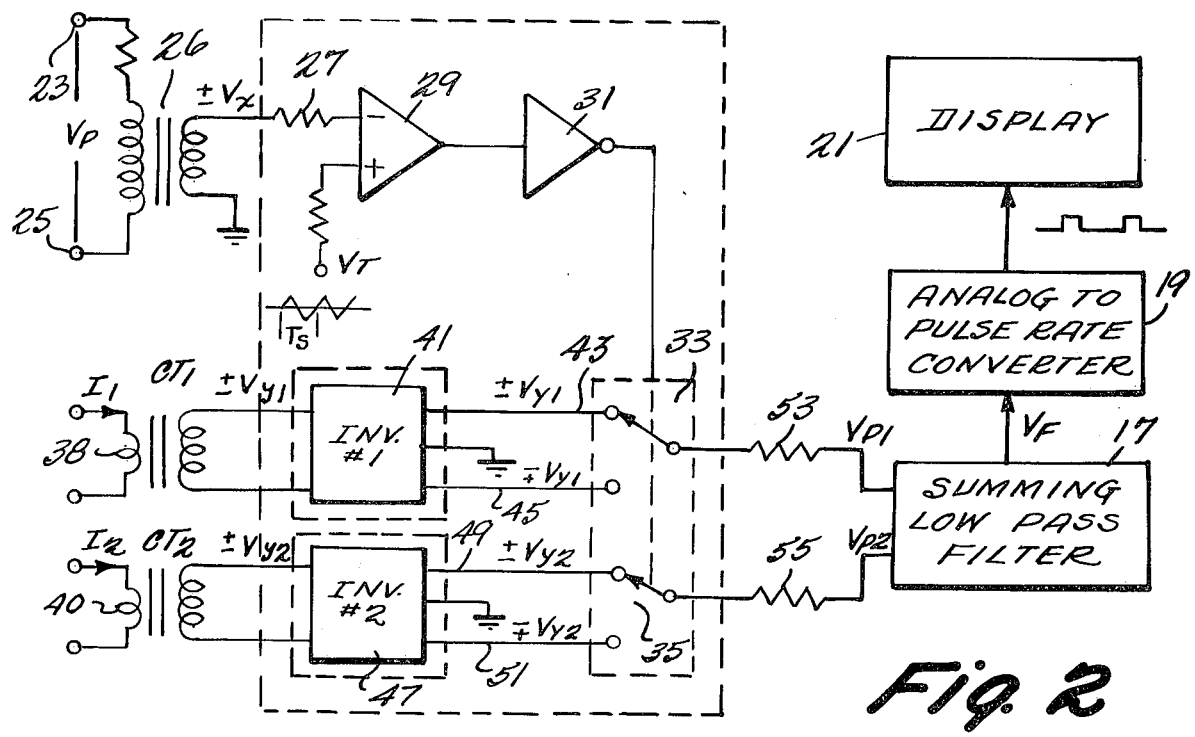
FIG. 2 is a more detailed schematic illustration of the metering system of the present invention showing a direct type pulse width amplitude multiplier.

Refer now to FIG. 2 which is a more detailed illustration of the electrical energy metering system of the present invention utilizing a direct-type pulse width amplitude multiplier. With reference to FIG. 2, there is shown a pair of input terminals 23 and 25 to which the system load voltage $V_P$ is applied. The voltage $V_P$ is transformed by a potential transformer 26 to a first analog signal $\pm V_x$ which is applied through a resistor 27 to an input of a comparator 29. The comparator 29 also receives as an input a cyclically varying reference signal $V_T$ which is in the form of a triangular wave generated by a triangle wave generator (not shown). The output of the comparator 29 which is a linear superposition of the input signal $\pm V_x$ and $V_T$ is applied to an inverter 31. The output of the inverter 31 is coupled to a pair of bipolar switches 33 and 35 which are illustrated schematically in FIG. 2 for simplicity in describing the present invention.

A pair of current transformers $CT_1$ and $CT_2$ are shown having their primary windings 38 and 40, respectively, connected in series with two wires of a three wire, single phase power consuming system. It should be understood that while only two current transformers are required for a three wire, single phase system, in general (N-1) current transformers and bipolar switches would be required for an N wire, single phase system.

The line current passing through the primary winding 38 is transformed by the current transformer $CT_1$ and appears as an analog voltage $\pm V_{Y1}$ which is coupled to an inverter circuit 41 to be described hereinbelow. The output of the inverter includes a signal $\pm V_Y$ on line 43 and a second signal $\pm V_Y$ (i.e. 180° out of phase to $\pm V_Y$) which appears on line 45. The line current passing through the primary of current transformer $CT_2$ is transformed by the current transformer $CT_2$ and coupled to a second inverter 47 which will be described more fully hereinbelow. The inverter 47 provides two output voltages, one $\pm V_{Y2}$ and the other $\pm V_{Y2}$ appearing on lines 49 and 51, respectively.

When the voltage output of inverter 31 is high or positive, the lines 43 and 49 are connected through the bipolar switches 33 and 35, respectively, to summing resistors 53 and 55, respectively. When, however, the output voltage of inverter 31 goes low or negative, the lines 45 and 51 are connectd through the bipolar switches 33 and 35 to the summing resistors 53 and 55, respectively.

In operation, the transformed voltage signal $\pm V_x$ is coupled to one input of the comparator 29. To the other input of the comparator 29 is coupled a triangular waveform $V_T$ having a frequency of $F_S$ which in the preferred embodiment is about 10 kHz. The output of the comparator 29 is a pulse width modulated pulse train having a pulse width which is proportional to the amplitude of the signal $V_x$ and of a frequency which is determined by the triangular waveform $V_T$. This pulse width modulated signal is utilized to drive the bipolar switches 33 and 35 simultaneously. The bipolar switches 33 and 35 in turn alternately couple the signals $\pm V_{Y1}$ and $\pm V_{Y2}$ which appear on lines 43, 45 and 49, 51 to the summing resistors 53 and 55, respectively, to provide a pulse width amplitude modulated signal in each of the resistors 53 and 55. Thus the output signals coupled to the resistors 53 and 55 averaged over a period $T_S$ is proportional to the instantaneous power in each of the load impedances of the three wire, single phase power consuming system. These signals are summed in a low pass filter 17 and appopriately filtered (i.e., integrated over the period of the system voltage) to provide a DC signal $V_F$ at the output of the low pass summing filter 17 which is given by the following expression:

$$V_F = K_6 V_P (I_1 \cos \theta_1 + I_2 \cos \theta_2) = K_7 P \quad (5)$$

where $K_6$ and $K_7$ are dimensional constants, $\theta_1$ is the phase angle between $V_P$ and $I_1$, $\theta_2$ is the phase angle between $V_P$ and $I_2$, P is the active power, and $V_P$, $I_1$ and $I_2$ are RMS values of the signals at the input terminals of the potential and current transformers 26, $CT_1$ and $CT_2$, respectively.

The function of the analog-to-pulse rate converter 19 is to integrate and quantize the active power P which active power is proportional to the voltage $V_F$ at the output of the low pass filter 17. The analog-to-pulse rate converter 19 may be of any desired design known in the art, however, it may preferably take the form fully explained in the aforementioned copending application Ser. No. 467,889. Also, as fully explained in this copending application, the output of the analog-to-pulse rate converter 19 is a pulse train wherein each pulse represents a quantized amount of energy given by the expression:

$$W_q = K_8 P T_q \quad (6)$$

where $K_8$ is a dimensional constant, $T_q$ is the quantization time and P is the measured system power. Thus the analog-to-pulse rate converter 19 delivers a series or train of pulses at its output with the accumulated number of output pulses representing the total electrical energy of the system. The output of the analog-to-pulse rate converter 19 is coupled to a register and display unit 21 which accumulates pulses and operates to display and record in decimal units the accumulated energy in kWh.

Figure 3:
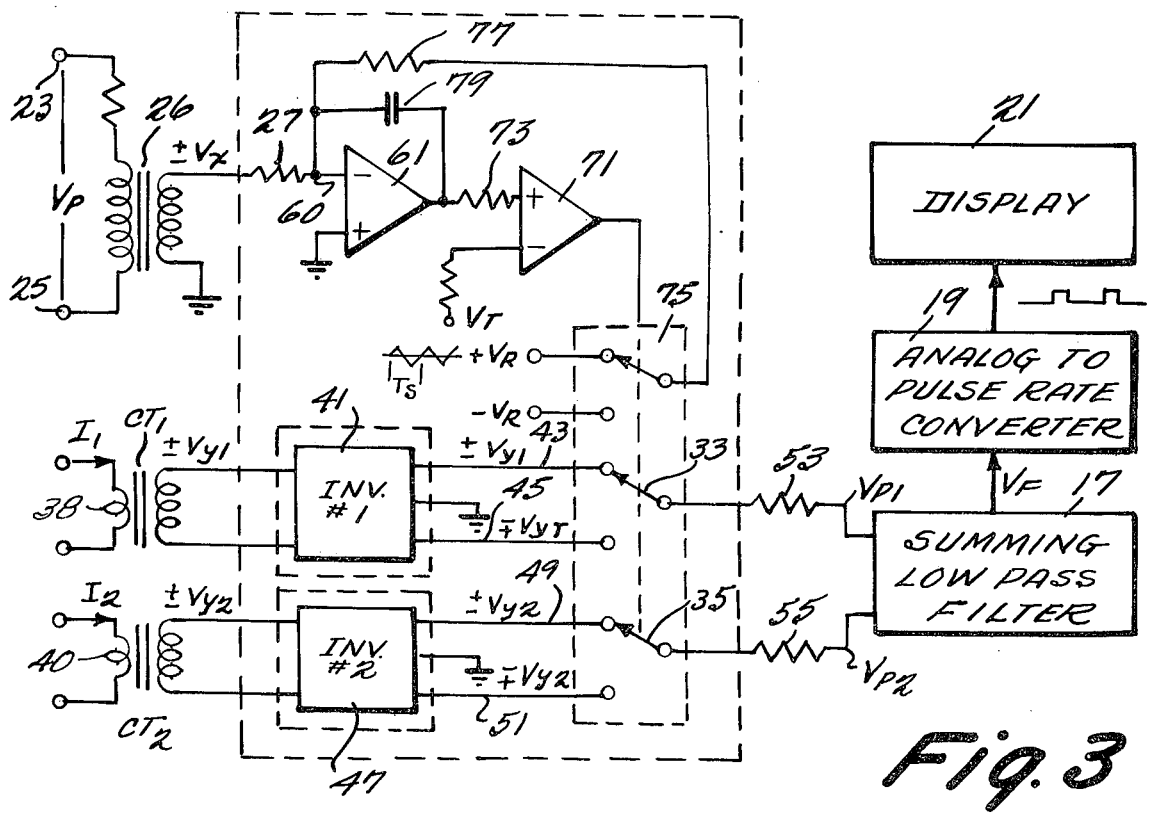
FIG. 3 is a schematic illustration of the electrical energy metering system of the present invention utilizing a feed-back type pulse width amplitude multiplier.

Refer now to FIG. 3 which is an alternate embodiment of the electrical energy metering system of the present invention wherein a feedback type pulse width amplitude multiplier is disclosed. The input terminals 23 and 25 of a potential transformer 26 are coupled across the load of a single phase, three-wire power consuming system. The transformed voltage signal $\pm V_x$ is coupled to an amplifier 61. The output of amplifier 61 is coupled to a comparator 71 via a resistor 73. To the other input of the comparator 71 is coupled a triangular waveform $V_T$ having a freqency $F_S$ which is large compared to the line frequency of the power consuming system. In the preferred embodiment, the frequency $F_S$ is 10 kHz. THe output of the comparator 71 is utilized to simultaneously drive three bipolar switches 75, 33 and 35. It should be understood, however, that each of the bipolar switches in a practical embodiment are formed of complementary MOS field effect transistors which function as switching elements in the manner described in the copending U.S. patent application Ser. No. 474,519, filed May 30, 1974 of Miran Milkovic titled "C-MOS Electronic kWh Meter and Method for Metering Electrical Energy", which is incorporated herein by reference thereto. Bipolar switch 75 alternately couples a positive reference voltage $V_R$ and a negative reference voltage $-V_R$ to the input of the amplifier 61 via feedback resistor 77 which signal alternately charges and discharges the feedback capacitor 79 which is connected across the amplifier 61.

For an input voltage $V_x$ equal to zero, the output of the comparator 71 consists of symmetrical pulses having a frequency of 10 kHz. This pulse train is used to drive analog switch 75 which switches the resistor 77 to $+V_R$ and to $-V_R$, thus producing equal currents $V_R/R_{77}$ into the summing point 60 of the amplifier 61.

The capacitor 79 is thus charged and discharged by equal currents so that the average value of the voltage across the capacitor is zero. For $V_x$ greater than zero, this balance in voltage is changed because capacitor 79 is no longer charged and discharged with equal currents. As a result, the voltage across the capacitor is no longer equal to zero. Due to the non-symmetry of the charging and discharging currents in the capacitor 79 due to the feedback circuit including the resistor 77, the signal at the output of comparator 71 no longer includes symmetrical pulses which are required to maintain the summing point 60 of the amplifier 61 at virtually zero potential. Thus, it can be shown that for the resistors 27 and 77 being equal, the duty cycle of the output voltage of the comparator 71 is given as follows:

$$T_A/T_S = \tfrac{1}{2}(1 - [V_x/V_R]) \quad (7)$$

wherein $T_S$ is the period of the triangular waveform $V_T$ and $T_A$ is the pulse width of the positive going portion of the output of comparator 71. It therefore can be seen that the value of $T_A$ is directly proportional to the input voltage $V_x$ provided the reference voltage level $V_R$ is maintained constant.

Current transformers $CT_1$ and $CT_2$ are each connected in circuit with two lines of a three-wire, single phase power consuming system. Current transformer $CT_1$ transforms the current $I_1$ in one line of the power system and couples the transformed current signal to an inverter circuit 41 while the current transformer $CT_2$ transforms the current $I_2$ flowing in a second wire of the three wire system and couples the transformed current to a second inverter 47. Inverters 41 and 47, which will be disclosed more fully hereinbelow, provide 180° out of phase signals on lines 43, 45 and 49 and 51. Thus, the signal on line 43 is $\pm V_{Y1}$ while the signal on line 45 is $\mp V_{Y1}$; the signal on line 49 is $\pm V_{Y2}$ and the signal on line 51 is $\mp V_{Y2}$. These signals are amplitude modulated by the output of comparator 71 which switches the bipolar switches 33 and 35 at a rate depending upon the output of the comparator 71. Thus, if the output of comparator 71 is a train of symmetrical pulses, the analog switches 33 and 35 switch the signals $\pm V_{Y1}$ and $\pm V_{Y2}$ to the output resistors 53 and 55 in such a way that the value of the voltage coupled to the resistors is equal to zero averaged over one period of the line voltage. However, if the output of comparator 71 is non-symmetrical, the value of the signals coupled to the resistors 53 and 55 becomes larger than zero. Mathematically, this can be described by the following expressions:

$$V_{P1} = V_{Y1} ([2T_A/T_s] - 1) \qquad (8)$$

and $$V_{P2} = V_{Y2} ([2T_A/T_s] - 1) \qquad (9)$$

By combining equation (7) into the aforementioned equations, the composite output voltage coupled to the summing low pass filter 17 is given as follow:

$$V_P = V_{P1} + V_{P2} = -[V_x/V_R](V_{Y1} + V_{Y2}) \qquad (10)$$

Thus, it can be seen that the output voltage from the multiplier is directly proportional to the product of $V_x$ and $(V_{Y1} + V_{Y2})$, provided, of course, the resistors 27 and 77 are equal and $V_R$ is a constant reference potential.

As in the case of the embodiment illustrated in FIG. 2, the summing low pass filter 17 sums the voltages appearing at the input thereof and filters out the high frequency components thereof to provide a DC signal $V_F$ which is proportional to the sum of the partial power dissipated in the three-wire, single phase power consuming system. This signal $V_F$ is converted to a pulse train by the analog-to-pulse rate converter 19, the output of which is accumulated, recorded and displayed in the display system 21.

Figure 4A:
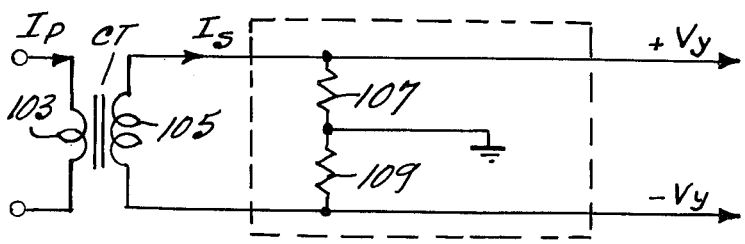
FIGS. 4a–4e illustrate current transformers terminated in passive and active load elements providing phase inverted signals.

Refer now to FIGS. 4a – 4e which illustrate different forms of the inverting circuits 41 and 47. Illustrated in FIG. 4a is a current transformer CT having a primary winding 103 and a secondary winding 105 with a current $I_P$ flowing through the primary winding 103 and a current $I_S$ induced in the secondary winding 105. The secondary current $I_S$ is converted to equal but inverted voltages $+V_Y$ and $-V_Y$ by means of a pair of resistors 107 and 109 which are connected across the secondary 105 of the current transformer. The values of the resistors 107 and 109 are equal and of very low value in order to provide for a virtual short circuit condition in the secondary 105 of the current transformer.

Figure 4B:
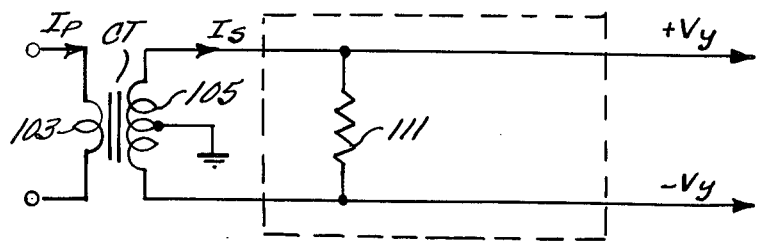

An improved arrangement is illustrated in FIG. 4b wherein the current transformer CT has a center tap in its secondary 105 to thereby avoid the requirement for a pair of low value, matched resistors such as is required in the embodiment of FIG. 4a. Hence, resistor 111 while being of low value to provide for a virtual short circuit condition in the secondary of the current transformer CT does not have to be matched with any other resistors to provide for equal and opposite voltages on the output leads thereof.

Figure 4C:
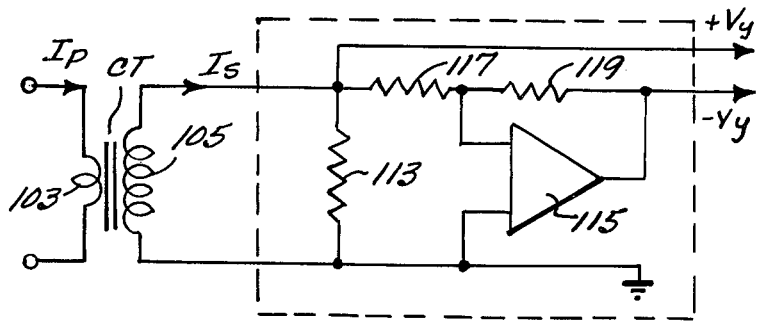

The circuit of FIG. 4c provides an even further improvement over the circuits illustrated in FIGS. 4a and 4b. A low value resistor 113 is connected across the secondary 105 of the current transformer CT but dissipates less current than in the resistor 111 or the resistors 107 and 109 shown in FIGS. 4b and 4a, respectively, because of the operational amplifier 115 and input resistor 117 which is connected thereacross. The operational amplifier 115 has a feedback resistor 119 connected thereacross which is of the same value as input resistor 117 so that the operational amplifier 115 has a unity gain. Thus the output $-V_y$ of the operational amplifier 115 is of the same magnitude but of opposite phase to the signal $+V_y$ at the junction of resistor 113 and input resistor 117.

Figure 4D:
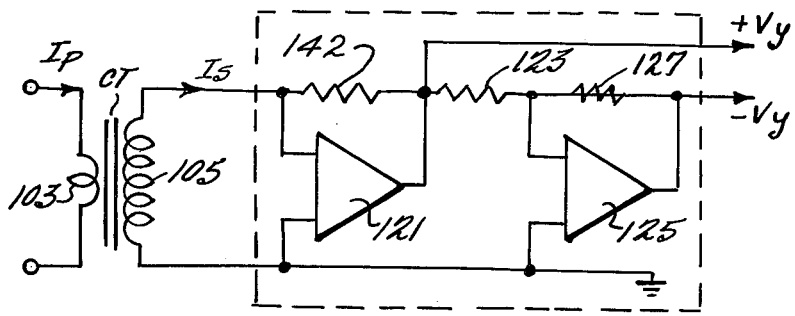

In FIG. 4d another circuit for providing phase inverted output signals is illustrated wherein an inverting operational amplifier 121 is coupled across the secondary of the current transformer CT. The output of the operational amplifier is coupled by means of resistor 123 to an inverting operational amplifier 125, with operational amplifier 125 having a resistance 127 connected across the input and output terminals thereof, whiich resistance is equal to the resistor 123. Thus the output of the operational amplifier 125 is equal in magnitude but opposite in phase to the signal output of the operational amplifier 121. The output of operational amplifier 121 is resistive feedback coupled through resistor 142, as shown in FIG. 4d, to the secondary 105 of the current transformer, thus the input of operational amplifier 121 is at virtual ground.

Figure 4E:
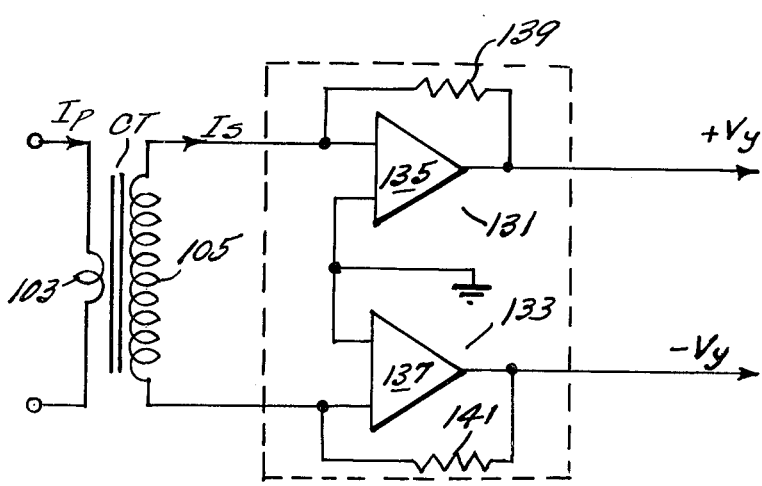

Still another method of providing inverted output signals from a current transformer is illustrated in FIG. 4e wherein two trans-resistance amplifiers 131 and 133 are provided which include operational amplifiers 135 and 137, respectively, which are connected in a push-pull arrangement. Since each of the operational amplifiers 135 and 137 has feedback resistors 139 and 141, respectively, connected across the input and output terminals thereof, the input terminals of the amplifiers 135 and 137 are at virtual ground in accordance with principles well known in the art. Thus a virtual short circuit appears across the secondary 105 of the current transformer CT with the output of the trans-resistance amplifier arrangement 131 being equal to the secondary current $I_S$ times the value of resistor 139. The output of the trans-resistance amplifier arrangement 133 is of exactly the same magnitude but of opposite polarity to the signal at the output of the operational amplifier 135 provided, of course, that the resistor 141 is equal to the resistor 139. Thus, the embodiment of FIG. 4e provides an inverter circuit which presents a virtual short circuit to the secondary winding 105 of the current transformer. It should be understood that any one of the circuits illustrated in FIGS. 4a–4e could be utilized for providing the inverted signals to the bipolar switches 33 and 35 illustrated in FIGS. 2 and 3.

Figure 5:
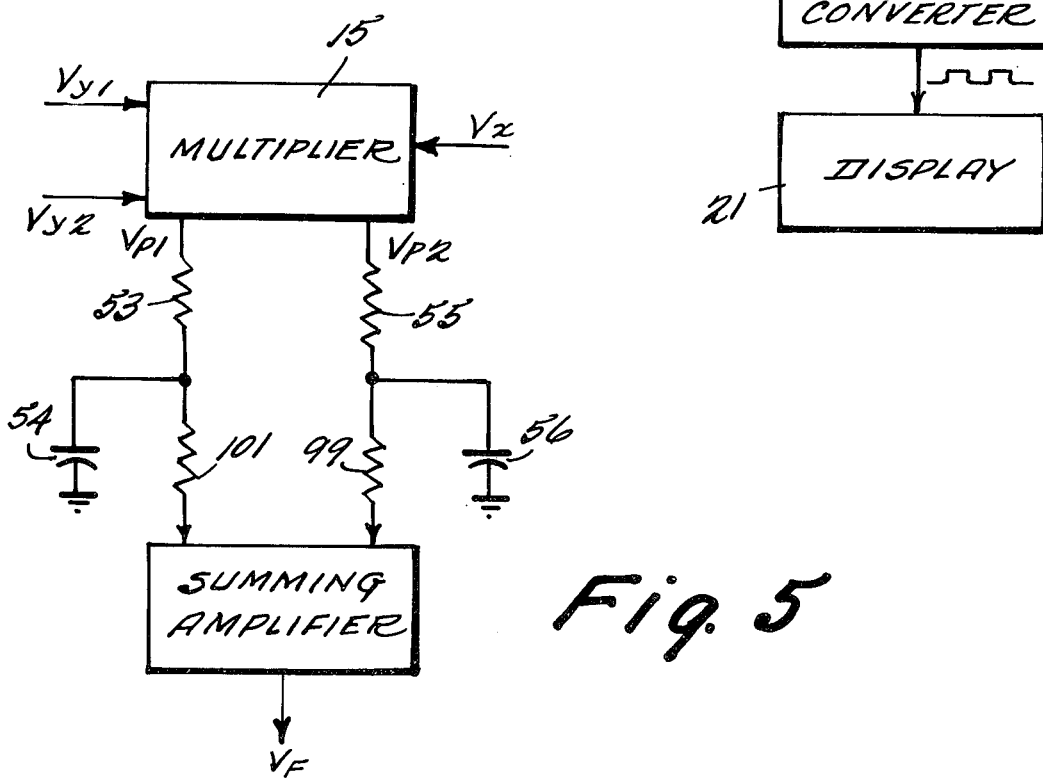
FIG. 5 is a schematic illustration of a circuit for summing and averaging the output of the multiplier.

Refer now to FIG. 5 which shows a preferred embodiment of the low pass filter arrangement of the present invention. Shown schematically coupled to the multiplier 15 which, as aforementioned, may be of the direct or the feedback type, is the voltage $V_x$ from the potential transformer and the voltages $V_{Y1}$ and $V_{Y2}$ which are derived from the respective current transformers. The outputs of the multipliers are coupled to a pair of resistors 53 and 55 which resistors are coupled to a source of reference potential such as ground by means of respective capacitors 54 and 56. The capacitors 54 and 56 in combination with the resistors 53 and 55 provide for a low pass filter thereby converting the outputs of the multiplier to DC signals having a value which is proportional to the partial powers generated by the product of the voltage $V_x$ and the current related voltages $V_{y1}$ and $V_{y2}$. These DC signals are then coupled to a summing amplifier of conventional design via resistors 99 and 101.

The aforegoing description of the preferred embodiment of applicant's invention illustrates a method and apparatus for measuring the energy consumed in a single phase, three-wire electrical system. However, it should be understood that the energy consumed in a single phase multi-wire electrical system can be measured using the concepts of the present invention simply by utilizing additional current transformers and inverters together with additional bipolar switches as would be obvious to one of ordinary skill in the art from the teachings of the aforementioned detailed description of the preferred embodiment of applicants's invention. The outputs of the bipolar switches can be appropriately filtered and summed in a summing amplifier and then converted to a pulse train for eventual display in an output display system. Accordingly, by the present invention applicant has disclosed a preferred embodiment of an invention for measuring the energy consumption in a single phase, multi-wire system utilizing C-MOS technology in such a manner that an efficient and accurate energy measuring system is provided.

While the present invention has been disclosed in connection with a preferred embodiment thereof, it should be obvious to one of ordinary skill in the art that there may be alternative embodiments which fall within the spirit and scope of the invention as defined by the appended claims.

What is claimed is:

1. In an N wire, single phase power consuming system, an electronic kWh meter for metering electrical energy comprising
    means for generating a first analog voltage representative of the voltage across the load impedance of said system,
    means for generating N—1 analog signals representative of the current flowing through each of N—1 wires,
    a multiplier means for simultaneously producing N—1 output signals representative of the product of said first analog voltage and each of said said N—1 current representative analog voltages, said product signals each being proportional to an instantaneous partial power consumed in said system,
    means receiving said product signals for deriving signals proportional to the average partial power consumed in said system, and
    means for summing said average partial power signals to derive the average power consumed in said N-wire single phase system.

2. The electronic kWh meter of claim 1 wherein said multiplier means comprises
    means for generating a cyclically varying reference signal, said reference signal having a frequency which is high compared to the line frequency of said system,
    means for linearly superimposing said reference signal and said first analog signal to form a pulse train which is pulse width modulated in accordance with said first analog voltage, and
    N—1 bipolar switches for selectively coupling said N—1 current representative voltages to said average partial power signal deriving means, said N—1 bipolar switches being activated by said width-modulated pulse train to form at the multiplier output a plurality of output pulse trains each representative of instantaneous partial power in said system.

3. The electronic kWh meter of claim 2 wherein said multiplier includes means for generating an additional N—1 current representative analog signals, each phase shifted 180° with respect to said first N—1 current representative analog signals but equal in amplitude thereto, and wherein said N—1 bipolar switches each comprises an output terminal and first and second input terminals, and means coupling said current representative analog signals to said first input terminal and said additional current representative analog signals to said second input terminal, and means for coupling said width modulated pulse train to said N—1 bipolar switches to control the coupling of said first and second input terminals to said output terminal.

4. The electronic kWh meter of claim 3 wherein said means for generating an additional N—1 current representative analog signals comprise N—1 inverters.

5. The electronic kWh meter of claim 4 wherein said inverters each comprise a first operational amplifier resistive feedback coupled to the output of said means for generating said analog signals representative of the current flowing through said wires, and a second operational amplifier connected to the output of said first operational amplifier and having unity gain, said second operational amplifier providing an output which is equal in magnitude but opposite in phase to the output of said first operational amplifier, wherein the input of said first operational amplifier is at virtual ground.

6. The electronic kWh meter of claim 4 wherein said inverters each comprise a pair of operational amplifiers connected in a push-pull arrangement to the output of said means for generating said analog signals representative of the current flowing through said wires, each operational amplifier providing an output which is equal in magnitude but opposite in phase to the output of the other and wherein the input terminals of said operational amplifiers are at virtual ground.

7. In a three-wire, single phase, power consuming system, an electronic kWh meter for metering electrical energy comprising
    means for generating a first analog voltage representative of the voltage across the load impedance of said system,
    means for generating two analog signals representative of the current flowing through two wires of said three-wire system,
    a multiplier means for simultaneously producing two output signals representative of the product of said first analog voltage and each of said two current representative analog voltages, said product signals each being proportional to an instantaneous partial power consumed in said system,
    means receiving said product signals for deriving signals proportional to the average partial power consumed in said system, and means for summing said average partial power signals to derive the average power consumed in said three wire, single phase system.

8. The electronic kWh meter of claim 7 wherein said multiplier means comprises:
means for generating a cyclically varying reference signal, said reference signal having a frequency which is much greater than the line frequency of said system,
means for linearly superimposing said reference signal and said first analog signal to form a pulse train which is pulse width modulated in accordance with said first analog voltage,
two bipolar switches for selectively coupling said two current representative voltages to said average partial power signal deriving means, said bipolar switches being actuated by said width modulated pulse train to form at the multiplier output a plurality of output pulse trains each representative of the instantaneous power in said system.

9. The electronic kWh meter of claim 8 wherein said multiplier includes means for generating an additional two current representative analog signals, each phase shifted 180° with respect to said first two current representative analog signals but equal in magnitude thereto, and wherein said bipolar switches each comprise an output terminal and first and second input terminals, means for coupling said current representative analog signals to said first input terminals of said bipolar switches and means for coupling said additional current representative analog signals to said second input terminal of said bipolar switches, and means responsive to said width modulated pulse train for coupling said analog signals at said first and second terminals of said bipolar switches to said output terminals thereof.

10. The electronic kWh meter of claim 9 wherein said means for generating an additional current representative analog signal comprises an inverter.

11. The electronic kWh meter of claim 10 wherein said inverter comprises a first operational amplifier resistive connected to the output of said means for generating a current representative analog signal, the input of said operational amplifier being at virtual ground, and a second operational amplifier connected to the output of said first operational amplifier and having unity gain, the output of said second operational amplifier being equal in magnitude but opposite in phase to the output of said first operational amplifier.

12. The electronic kWh meter of claim 10 wherein said inverter comprises a pair of operational amplifiers connected in a push-pull arrangement across the output of said means for generating said analog signals representative of the current flowing through said wires, said operational amplifiers having the same gain and each providing an output which is equal in magnitude but opposite in phase to the other.

13. In an N wire, single phase, power consuming system, a method of metering electrical energy comprising the steps of:
generating a first analog voltage representative of the voltage across the load impedance of said system,
generating N–1 analog signals representative of the current flowing through each of said N–1 wires,
simultaneously producing N–1 output signals representative of the product of said first analog voltage and each of said N–1 current representative analog voltages, said product signals each being proportional to an instantaneous partial power consumed in said system,
deriving in response to said product signals signals proportional to the average partial power consumed in said system, and
summing said average partial power signals to derive the average power consumed in said N wire, single phase system.

14. The method of claim 13 wherein said simultaneously producing step comprises the steps of generating a cyclically varying reference signal, said reference signal having a frequency which is high compared to the line frequency of said system, linearly superimposing said reference signal and said first analog signal to form a pulse train which is pulse width modulated in accordance with said first analog voltage, selectively coupling said N–1 current representative voltages to an output in accordance with said width modulated pulse train to form at the output a plurality of output pulse trains each representative of instantaneous partial power in said system.

* * * * *